(12) United States Patent
Larson et al.

(10) Patent No.: US 12,158,437 B2
(45) Date of Patent: Dec. 3, 2024

(54) XPS METROLOGY FOR PROCESS CONTROL IN SELECTIVE DEPOSITION

(71) Applicant: NOVA MEASURING INSTRUMENTS INC., Freemont, CA (US)

(72) Inventors: Charles Larson, Belmont, CA (US); Kavita Shah, Mountain View, CA (US); Wei T Lee, San Jose, CA (US)

(73) Assignee: NOVA MEASURING INSTRUMENTS INC., Fremont, CA (US)

( * ) Notice: Subject to any disclaimer, the term of this patent is extended or adjusted under 35 U.S.C. 154(b) by 0 days.

(21) Appl. No.: 18/337,397

(22) Filed: Jun. 19, 2023

(65) Prior Publication Data

US 2024/0044825 A1    Feb. 8, 2024

Related U.S. Application Data

(63) Continuation of application No. 17/804,599, filed on May 30, 2022, now Pat. No. 11,680,915, which is a continuation of application No. 16/351,153, filed on Mar. 12, 2019, now Pat. No. 10,801,978.

(60) Provisional application No. 62/641,430, filed on Mar. 12, 2018.

(51) Int. Cl.
*G01N 23/2273*    (2018.01)
*C23C 16/06*    (2006.01)
*C23C 16/24*    (2006.01)
*C23C 16/455*    (2006.01)
*C23C 16/52*    (2006.01)
*H01L 21/67*    (2006.01)

(52) U.S. Cl.
CPC ......... *G01N 23/2273* (2013.01); *C23C 16/06* (2013.01); *C23C 16/24* (2013.01); *C23C 16/45529* (2013.01); *C23C 16/52* (2013.01); *H01L 21/67253* (2013.01)

(58) Field of Classification Search
CPC .... G01N 23/2273; C23C 16/06; C23C 16/24; C23C 16/52; C23C 16/45529; H01L 21/67253; H01J 37/222; H01J 37/302; H01J 37/3023
USPC ........................................................ 250/305
See application file for complete search history.

(56) References Cited

U.S. PATENT DOCUMENTS

2006/0108545 A1   5/2006  Yoshiki et al.
2008/0057198 A1*  3/2008  Yoon ................. H01L 21/76861
                                                                 427/404
2015/0303051 A1* 10/2015  Takeda ................... C23C 16/52
                                                                 438/758

* cited by examiner

*Primary Examiner* — Jason L McCormack
(74) *Attorney, Agent, or Firm* — Reches Patents

(57) ABSTRACT

XPS spectra are used to analyze and monitor various steps in the selective deposition process. A goodness of passivation value is derived to analyze and quantify the quality of the passivation step. A selectivity figure of merit value is derived to analyze and quantify the selectivity of the deposition process, especially for selective deposition in the presence of passivation. A ratio of the selectivity figure of merit to maximum selectivity value can also be used to characterize and monitor the deposition process.

12 Claims, 2 Drawing Sheets

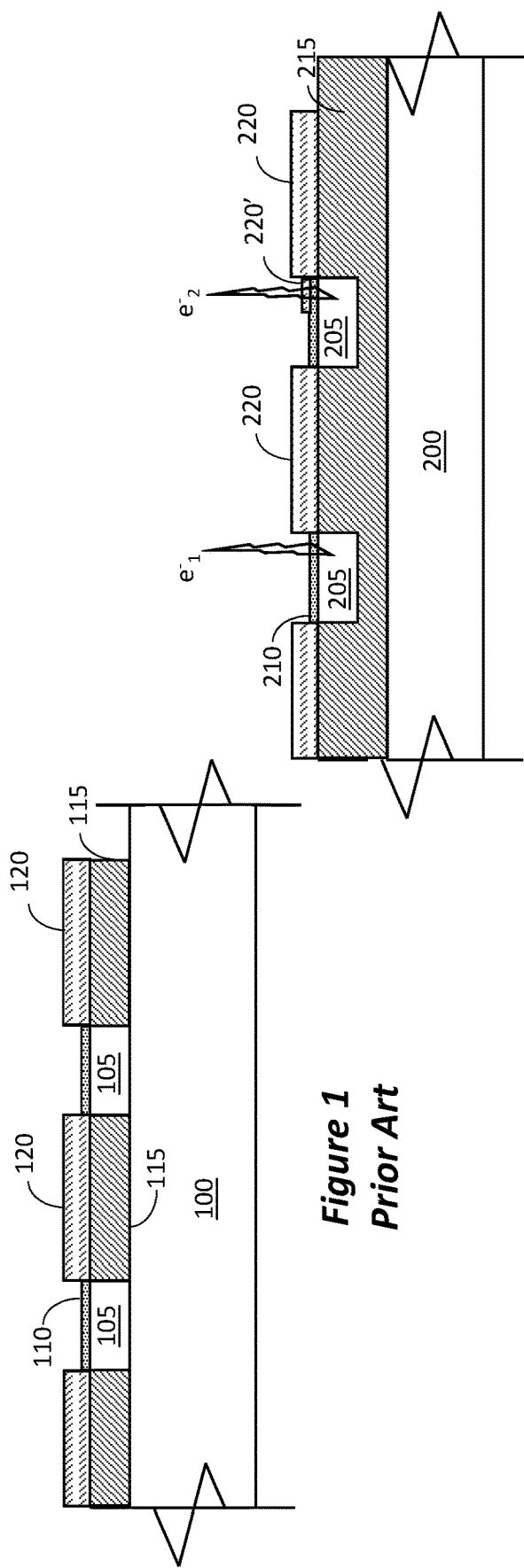
*Figure 1*
*Prior Art*
*Figure 2*
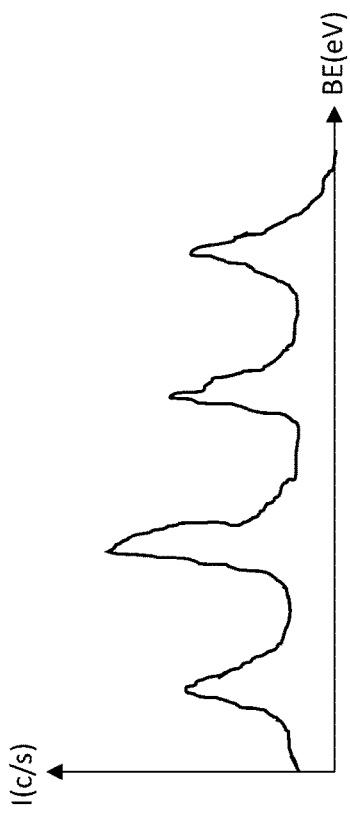
*Figure 3*

XPS METROLOGY FOR PROCESS CONTROL IN SELECTIVE DEPOSITION

CROSS-REFERENCE TO RELATED APPLICATIONS

This application is a continuation of U.S. application Ser. No. 16/351,153, filed Mar. 12, 2019, which claims the benefit of U.S. Provisional Application No. 62/641,430, filed Mar. 12, 2018, which are hereby incorporated by reference in its entirety.

BACKGROUND

1. Field

This disclosure relates generally to the field of process control and monitoring in the semiconductor fabrication field. The disclosed process control technique is particularly suitable for monitoring selective deposition processes.

2. Related Art

For decades the semiconductor industry relied on photolithography to generate the patterning required for the chips' circuitry. Photolithography enabled depositing each layer over the entire wafer, and then patterning the layer to form the circuitry. In addition to adding many steps and cost to the chip fabrication process, current nano-scale features make photolithography incredibly difficult and, indeed, perhaps at some point impossible. Additionally, double and multi-patterning used to define nano-scale features (requiring two or more separate lithography and etch steps to define a single layer) may lead to unacceptable edge placement errors (EPE) and overlay misalignments.

An emerging technique, called Selective Deposition, deposits each layer only at the areas of the designed circuitry, thus avoiding the need for photolithography patterning. One promising example of selective deposition is the use of Atomic Layer Deposition (ALD) to repeatedly form Self-Assembly Monolayers (SAM), wherein each monolayer is deposited only at the regions of the designed circuitry. A similar technique, Molecular Layer Deposition (MLD) is used for deposition of organic materials. Generally, the top surface of the substrate has a dielectric pattern, a metal pattern, and possibly a semiconductor pattern, and the next layer to be formed may be a metal layer over the metal pattern, a dielectric layer over the dielectric pattern, or a semiconductor over the semiconductor pattern. This may require area activation or area deactivation (passivation) prior to the next layer's formation. The ALD deposition using SAM with surface passivation may be a promising technique as it both avoids the photolithography step and uses the surface's chemistry to make the alignments, thus preventing EPE and overlay errors.

Regardless of which technique is used, metrology and process control tools will be required in order to implement an integrated process with acceptable yield. However, to date no suitable metrology tools have been developed for process monitoring and qualification. The conventional tools used in the labs today for investigating these processes include Scanning Electron Microscopy (SEM), Atomic Force Microscopy (AFM) and Tunneling Electron Microscopy (TEM). These tools are too slow to be employed in a production environment, and are incapable of providing real-time monitoring of the process, so as to indicate a drift or a failure of the process in a commercial fabrication setting.

X-ray photoelectron spectroscopy (XPS) has been used to analyze surface chemistry of substrates. XPS spectra are obtained by irradiating the substrate with a beam of X-rays, while simultaneously measuring the kinetic energy and number of electrons that escape from the top layers of the substrate. Similarly, X-ray fluorescence (XRF) has been widely used for elemental and chemical analysis of samples, by sampling the emission of characteristic "secondary" (or fluorescent) X-rays from a material that has been excited by bombarding with high-energy X-rays or gamma rays.

3. Problem to be Solved

In order to enable selective deposition in commercial fabrication environment, a need exists in the art for process monitoring and control. The methodology should provide a fast, direct, non-destructive measurements of the quality of the process on the wafer, to enable analysis of process quality and detection of process drift.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments enable analyzing and monitoring deposition and/or passivation processes, especially in the context of selective deposition. The embodiments also provide figures of merit to enable quantifying the quality of the process and identifying process drifts or predicting required maintenance of the deposition equipment. As such, the embodiments enable the implementation of selective deposition in a commercial fabrication environment.

In the disclosed embodiments, XPS measurements are used to analyze the quality of layers formed during selective deposition. The measurements can be implemented during different steps of the selective deposition, e.g., to analyze the quality of the passivation, the quality of the deposited layer, the presence of deposited material over the passivated areas, the presence of pinholes, etc. As such, the disclosed embodiments help ensure that material is deposited properly in areas where it should be deposited, and that no material is deposited where it should not be deposited.

Examples disclosed herein illustrate the use of relative XPS intensities to determine metrics for process results, such as passivation and degree of selectivity.

In the context of selective deposition process, disclosed embodiments enable quantification of the passivation and the selectivity. In one aspect, the passivation is evaluated by generating a metric referred to as goodness of passivation (GoP), which enables evaluation of the passivation of a sample against optimal or required passivation quality. The GoP is a functional operation of XPS intensities. For example, the GoP may be a "ratio of ratios", by setting the functional operation to be a ratio of two integrated intensities ratios. In such an example, the ratio may be a linear ratio, a ratio of the squares of the XPS intensities, a ratio of the square root of the XPS intensities, etc. Thus, the use herein of the term ratio is intended to encompass any of these functional ratios.

In one example, first, a reference ratio is generated by performing XPS measurements of a reference wafer, and taking the ratio of the integrated intensity of the passivation atomic species over the passivated atomic species. For example, when the passivated layer is metal lines, e.g., copper lines, and the passivation is undecanethiol (UDT), the passivation atomic species would be sulfur and the passivated atomic species would be copper. During the selective deposition process, after passivation has been formed on a sample wafer, XPS measurements are taken of the sample wafer and a sample ratio is generated by taking the ratio of the integrated intensity of the passivation atomic species over the passivated species for the sample wafer. The GoP is generated by a functional operation, e.g., taking the ratio, of the sample ratio and the reference ratio.

The reference wafer may incorporate both layers, such that the measurements may be taken concurrently. For the example of a Sulphur based passivation of copper, the reference sample may be a silicon wafer with a blanket Cu layer (or large regions of Cu, such as metrology pads) and an S based passivation layer on the top of the Cu. The XPS reference data from the Cu and S would be collected at the same time (or nearly at the same time).

According to further aspects, the selectivity of the deposition process is quantified. For example, when performing atomic layer deposition (ALD) of a second dielectric over an underlying low-k dielectric, in the presence of passivated metal lines, it is desirable to verify that the second dielectric is indeed deposited over the low-k dielectric, and that no dielectric is deposited over the passivated metal lines. To that effect, disclosed embodiments provide a Selectivity Figure of Merit (SFM) that can be used to determine whether an acceptable selectivity has been achieved. The SFM is a functional operation, e.g., a ratio of two ratios. First, XPS measurements of a reference wafer are taken and are used to derive two reference values: reference integrated intensity of the metal lines species (e.g., copper) and reference integrated intensity of the underlying dielectric species (e.g., silicon). After an x cycles of ALD selective deposition process are performed on a sample wafer, XPS measurements of the sample wafer are taken and are used to derive two sample values: sample integrated intensity of the metal lines species (e.g., copper) and sample integrated intensity of the underlying dielectric species (e.g., silicon). A first species ratio is obtained by taking the ratio of the sample integrated intensity of the metal lines species over the reference integrated intensity of the metal lines species. For perfect selectivity this ratio should approach 1, indicating that no dielectric has been deposited over the metal lines. A second species ratio is obtained by taking the ratio of the sample integrated intensity of the dielectric species over the reference integrated intensity of the dielectric species. The integrated intensity of the dielectric species would be attenuated with increased number of ALD cycles. The SFM is obtained by a functional operation, e.g., taking the ratio of the first species ratio over the second species ratio.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a partial cross-section of a prior art structure for selective deposition.

FIG. 2 illustrates a selective deposition structure according to a disclosed embodiment.

FIG. 3 illustrates XPS spectra indicating peaks corresponding to four species, according to disclosed embodiment.

DETAILED DESCRIPTION

Figure 4C:
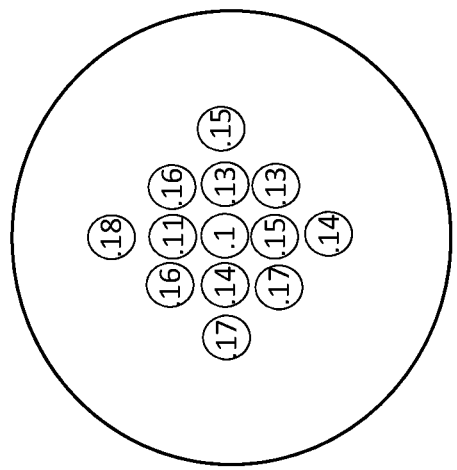
FIGS. 4A-4C illustrate wafer mapping of GoP according to disclosed embodiment.

Embodiments of the inventive deposition process control and monitoring will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

FIG. 1 illustrates a cross-section of a prior art device demonstrating a selective deposition process. The substrate 100 may include other layers between the top surface and the illustrated circuitry on top of the substrate, but these layers are not relevant to the subject discussion and are, therefore, not shown. The circuitry shown in the example of FIG. 1 includes metal traces 105, a passivation layer 110 over the metal traces 105, first dielectric layer 115, and a second dielectric layer 120. An example of a process for fabricating the structure shown in FIG. 1 includes the deposition and patterning of the metal traces 105, e.g., metal lines inside trenches formed in the first dielectric layer 115. Then, the metal traces 105 are passivated so that when the second dielectric layer 120 is formed by selective deposition, no dielectric material will attach to the metal lines. After the formation of passivation layer 110, the second dielectric layer 120 is formed by, e.g., ALD selective deposition. After forming the second dielectric layer 120, the passivation layer 110 can be removed. However, during this process there are at least two steps during which the process can fail. First, if the passivation layer is not properly formed, dielectric material may form over the metal lines. Second, if the second dielectric layer is insufficiently thick, or has voids, it may lead to device failure. Thus, it is desirable to be able to non-destructively test the wafer during fabrication to avoid such failures.

According to some embodiments, SAM of undecanethiol (UDT) is used as passivation over the metal traces to enable selective deposition of second dielectric layer over an underlying dielectric layer. The UDT may be, e.g., 11-amino-1-undecanethiol, 11-mercapto-1-undecanol (OH—C11), and 11-amino-1-undecanethiol hydrochloride (NH2-C11). By forming several layers of SAM UDT, it prevents the dielectric from attaching to the metal layer, thus selectively depositing dielectric only over the underline dielectric areas. However, according to disclosed embodiments, it is preferable to determine the quality of the SAM UDT prior to performing the selective deposition of the dielectric, so as to ensure no dielectric adheres to the metal.

In a first example, XPS is used to determine the quality of a deposited layer over a blanket wafer, which can be used, e.g., to generate a baseline for future testing. In this example, the wafer is coated with a uniform layer of copper, and ALD is used to form a layer of HfNx (Hafnium nitride) over the entire copper layer. First, XPS is used to obtain the signal spectrum obtained from the wafer with only the copper layer. Then the spectrum is obtained after an intermediate number of ALD cycles, say ten cycles of HfNx deposition. The intensity of the spectra for the copper signal is expected to drop following successive deposition, as the electrons from the copper layer now must travel through a certain thickness of HfNx. At the same time, the intensity of the HfNx specie should increase, indicating the increased amount of HfNx present over the copper. This is repeated over certain number of cycles of ALD, such that as the intensity of the spectra from the copper is diminished, the spectra from the HfNx layer intensifies. Thus, one obtains a baseline of the signals for an HfNx layer growing over copper. By comparing spectra taken during future manufacturing cycles with these spectra, one can monitor the formation of the deposited layer.

In a separate process, the copper is first passivated with SAM UDT prior to performing the ALD HfNx growth and measurements cycles. In this embodiment the top layer of the substrate includes lines of copper interspersed with areas of dielectric material. In a first step, the copper lines are passivated by forming several layers of SAM UDT. One or more XPS spectra may be taken to obtain the signature of the copper emission through the UDT layers. Thereafter, selective deposition of dielectric HfNx is performed and one or more spectra may be taken to obtain signature of the copper emission and the dielectric emission. The copper emission may be used as calibration for future investigation whether dielectric is being deposited over the copper or determine degradation of the UDT, while the dielectric emission can be used as calibration for future examination of the quality of the deposited dielectric HfNx over the dielectric.

The discussion will now refer to FIG. 2 to present an embodiment that provides a figure of merit for the quality of a passivation layer. The same process can be implemented to provide a figure of merit for a selective deposition process, but as the passivation process may prove essential in selective deposition technology, a first example is provided with respect to passivation, and is referred to a "goodness of passivation" (GoP) measurement. The GoP value can be used to monitor the process for the quality of the passivation and for undesirable dielectric deposition over the passivation. The passivation may be, e.g., a SAM UDT or other organic or inorganic layers. Notably, in case of UDT, which is formed of long chains of polymeric molecules, the formed layers are optically transparent, such that optical inspection of the DUT layers is not possible.

In FIG. 2, metal lines 205, e.g., copper, are interspersed between first dielectric areas 215, e.g., low-k SiO2, etc., over substrate 200. Passivation 210 may be, e.g., SAM UDT, and the selectively deposited second dielectric 220 may be, e.g., HfNx. Some circuitry layers may exist between the substrate 200 and the first dielectric 215, but is omitted for clarity. As illustrated in FIG. 2, while ideally the UDT would passivate only the metal lines 205 and the HfNx would deposit only on top of the first dielectric 215, in this case some of the second dielectric 220 has been deposited over the passivation 210, and is identified as 220'. As the deposition of dielectric 220' is undesirable, an objective of this embodiment is to identify how much of dielectric 220' is present on the passivation 210, i.e., over the metal lines 205.

As illustrated in FIG. 2, when taking XPS spectra, some photoelectrons emitted from the metal line 205, identified as $e^-_1$, travel only through passivation layer 210, and thus are attenuated accordingly. Conversely, some photoelectrons, identified as $e^-_2$ travel through both the passivation layer 210 and the dielectric 220', and are attenuated to a different degree.

FIG. 3 illustrates hypothetical spectra taken from a structure such as that shown in FIG. 2. The abscissa indicates the binding energy in electron volts, while the ordinate indicates the intensity in counts per second. Thus, the signal along the abscissa indicates what atomic species are present in the sample, while the intensity indicates the abundance of that specie.

In one series of experiments, wafers with blanket copper layer were used to deposit a blanket HfNx layer, with and without a layer of UDT. XPS intensities for Cu3p were taken at different number of ALD HfNx deposition cycles. Of course, with UDT over the copper no HfNx deposition is expected, hence no attenuation of the Cu3p intensity is expected. The experiments were repeated using patterned wafers with copper lines over low-k dielectric, with and without UDT over the copper lines. For blanket wafers without UDT, as the number of HfNx ALD cycles increased, the Cu3p signal decreased while the Hf4f signal increased, indicating HfNx deposition over the copper. Also, there was drastic attenuation of the Cu3p signal for HfNx ALD cycles on patterned wafer when no UDT was present, thereby indicating that the HfNx was deposited on the copper when no UDT was present on the copper lines. On the other hand, it was noted that there was little Cu3p signal attenuation after up to 80 ALD cycles of HfNx when UDT was present over the copper, for both blanket and patterned wafers. This confirmed that UDT acts to prevent HfNx deposition over the copper.

However, it was unexpectedly discovered that when taking the XPS spectra after UDT, but prior to performing the HfNx ALD, the attenuation of the Cu3p signal was much more drastic for blanket wafers covered with UDT than for patterned wafer covered with UDT, indicating that the UDT coverage of the copper lines of the patterned wafer was not as good as the coverage of blanket wafers. In fact, while the intensity of the Cu3p dropped by an order of magnitude on blanket wafers after forming the UDT passivation, there was much smaller intensity attenuation for the corresponding patterned wafers. The inventors then postulated, and have then unexpectedly discovered, that using the ratios of the XPS intensities, the quality of the selective deposition process, including the passivation, can be evaluated and monitored.

Similar experiments were made with blanket wafers having a layer of low-k dielectric covering the entire wafer. XPS spectra were taken over several ALD cycles of HfNx deposition, with and without an intervening UDT layer. It was noted that the Si2p signal from the underlying low-k dielectric was attenuating as the number of ALD cycles increased, with or without the intervening UDT. It was also noted that the Hf4f signal was increasing with or without the intervening UDT. It was thus confirmed that the UDT does not passivate the low-k dielectric.

As can be understood, the quality of the passivation is critical to the selective deposition process. Accordingly, the inventors have developed a method for characterizing the quality of the passivation, which is referred to herein as Goodness of Passivation (GoP). The GoP is a function of the XPS signal intensities measured at different stages of the process. In this example, the function is a ratio (linear, quadratic, etc.) of XPS signal intensities and is a unitless fraction between zero and one, i.e., $0 \leq GoP \leq 1$. The GoP can be expressed as $GoP = f\{(I_P/I_{Subst})_s, (I_P/I_{Subst})_0\}$, which, using the linear ratio function, is expressed as $GoP = (I_P/I_{Subst})_s/(I_P/I_{Subst})_0$; wherein Ir is the XPS signal intensity of a specie forming the passivation (I being the integrated intensity of the XPS spectrum for a selected specie), $I_{Subst}$ is the XPS signal intensity of a specie from the underlying layer, e.g., copper, $(I_P/I_{Subst})_s$ is the measurements of the sample of interest, and $(I_P/I_{Subst})_0$ is the measurements of a reference perfect passivation. Thus, if the XPS measurements of the sample result in the same values as those of the reference, the GoP equals 1. On the other hand, as the measurements of the sample relate to inferior passivation, the GoP results in a number that is smaller than 1, and is decreasing with the inferiority of the passivation.

Applying the method of GoP to the embodiment illustrated in FIG. 2, the spectra of sulfur is selected as the species of the passivation layer and the spectra of copper is selected as the specie for the underlying layer. Thus, the Goodness of Passivation relationship becomes $$GoP = (I_{Passivation}/I_{Metal})_s/(I_{Passivation}/I_{Metal})_0 = (I_S/I_{Cu})_s/(I_S/I_{Cu})_0;$$

such that with improved passivation $I_{Passivation}$ increases and $I_{Metal}$ decreases, and when the measured passivation reaches maximum quality the GoP ratio becomes 1, i.e., $(I_{Passivation}/I_{Metal})_s = (I_{Passivation}/I_{Metal})_0$. The values for $(I_{Passivation}/I_{Metal})_0$ can be obtained by measurements of passivation on a blanket copper wafer.

As one example, the following embodiment utilizes the GoP relationship to monitor the process in-line. Specifically, XPS spectra of a substrate having a known perfect passivation are obtained, to provide values for $(I_P/I_{Subst})_0$. An acceptable ratio threshold is set for GoP, under which it is believed that the process results in unacceptable quality of passivation. The process proceeds by taking XPS spectra of wafers prior to and after passivation, to calculate $GoP_i$ for each or every x number of wafers being processed. The resulting $GoP_i$ is compared to the threshold. When $GoP_i$ falls below the threshold, an alarm is issued and the passivation process may be halted to investigate the reasons for the resulting low quality passivation.

After the quality of passivation has been confirmed by an acceptable GoP value, the wafers may proceed to the selective deposition step. Generally, it is considered that the second dielectric would indeed be deposited selectively only over the areas of the first dielectric. Nevertheless, should this step be required to be monitored, the GoP measurement can be used. That is, if during the ALD process the second dielectric material is being deposited on the passivation layer, it will change the value of the GoP, thus indicating problem in the process. To illustrate, the GoP measurement can be done on the wafer prior to the start of the deposition as a reference value, and then during deposition to check whether the value changes during or after the deposition process. If ALD process is depositing HfO on the passivation layer, the GoP will likely change as the HfO will attenuate the Cu and S signals differently.

Alternatively, or additionally, a measure can be derived as Goodness of Selective Deposition (GoSD), which is a function of XPS intensities of the passivation and deposition species. The GoSD may be a ratio (linear, squared, etc.), wherein in a linear fraction form it can be expressed as $GoSD = (I_{SD}/I_P)_s/(I_{SD}/I_P)_0$; wherein $I_P$ is the XPS signal intensity of the passivation specie and $I_{SD}$ is the XPS signal intensity of the selective deposition specie. The reference values are $(I_{SD}/I_P)_0$, while the sample values are $(I_{SD}/I_P)_s$.

The GoSD can also be determined using XPS of the deposition and underlying species. To illustrate, in the example of ALD deposition of HfO, first HfO is deposited on a reference wafer having blanket layer or large pads of SiO2. An XPS measurement is performed on the reference wafer to obtain $(I_{Hf}/I_{Si})_0$. Then a patterned wafer is passivated and HfO2 is deposited over the passivated wafer. An XPS measurement is taken after deposition to obtain the values $(I_{Hf}/I_{Si})_s$. The two ratios should be the same if the deposition was selective. If the ratio resulting from the patterned wafer is higher, it indicates that HfO grew on the metal, meaning failed passivation. If the value is lower, it means incomplete deposition of HfO2 over the SiO2.

In the selective deposition process integration scheme, once the second dielectric selective deposition step is completed, the passivation layer is removed. In that step, the GoP measurement can be used to monitor how well the passivation was removed, except that the intensity measurements that are used are from XPS signals taken before and after removal of the passivation. Thus, the relationship may be expressed as goodness of passivation removal—$GoPR = (I_{PR}/I_{SD})_s/(I_{PR}/I_{SD})_0$; wherein $I_{PR}$ is the XPS signal intensity after passivation removal and $I_{SD}$ is the XPS signal intensity after the selective deposition process.

Ultimately, what is required for a successful selective deposition process is high selectivity, meaning proper deposition in the areas where the deposition is required to occur, and no deposition on areas where no deposition is required to occur. When the selectivity is between a first material having element A and a second material having element B, the inventors have developed a Selectivity Figure of Merit (SFM) which is a function of XPS intensities of elements prior to the start and after a number of cycles of deposition. In one example the SFM is implemented using ratios of XPS signal intensities, as follows: $SFM = (I_{Ai}/I_{A0})/(I_{Bi}/I_{B0})$, wherein $I_{Ai}$ is the signal intensity from element A after i cycles of selective deposition, $I_{A0}$ is the signal intensity from element A prior to start of selective deposition, $I_{Bi}$ is the signal intensity from element B after i cycles of selective deposition, and $I_{B0}$ is the signal intensity from element B prior to start of selective deposition.

For example, applying the SFM formula to the embodiment of FIG. 2, wherein metal copper lines are interspersed on a low-k first dielectric, a SAM UDT passivation is formed over the copper lines, and x cycles of selective deposition of HfNx, one gets:

$$SFMx = (I_{Cux}/I_{Cu0})/(I_{Six}/I_{Si0});$$

wherein $I_{Cux}$ is the signal intensity of Cu3p after x cycles of selective deposition, $I_{Cu0}$ is the signal intensity of Cu3p prior to start of selective deposition (but after passivation), $I_{Six}$ is the signal intensity from Si2p after x cycles of selective deposition, and $I_{Si0}$ is the signal intensity from Si2p prior to start of selective deposition. That is, the values $I_{Cu0}$ and $I_{Si0}$ are obtained from a passivated wafer prior to the start of the deposition. The values $I_{Cux}$ and $I_{Six}$ are obtained from the same wafer, after x cycles of selective deposition.

When the HfNx is deposited only over the low-k dielectric, i.e., perfect selectivity, the ratio $I_{Cux}/I_{Cu0}$ should equal or approach 1, i.e., no attenuation of the XPS signal from copper. Under such conditions the intensity attenuation of Si would depend on ideal HfNx thickness at x cycles of selective deposition. Therefore, the SFM correlates to both avoidance of deposition of HfNx over the copper and the quality of HfNx deposition over the low-k dielectric.

The data obtained from the experiments on blanket wafers can be used to compare to the data obtained from testing on patterned wafers. For example, the intensities obtained for Cu3p when forming HfNx deposition over blanket copper wafer can be used to generate ideal value for $I_{Cux}/I_{Cu0}$. Similarly, intensity values obtained for Si2p when forming HfNx deposition over blanket low-k wafer can be used to obtain ideal value for $I_{Six}/I_{Si0}$. The "perfect" or maximum selectivity can be calculated by setting $I_{Cux}/I_{Cu0}=1$ and using the blanket wafer data to set the value for $I_{Six}/I_{Si0}$, resulting in SFMMAX=$1/(I_{Six}/I_{Si0})_{MAX}$, i.e., $SFM_{MAX}$ equals the reciprocal (or multiplicative inverse) of $(I_{Six}/I_{Si0})_{MAX}$. The resulting $SFM_{MAX}$ value is the best selectivity to be achieved in the process, and one may use that value to derive a threshold value beyond which the process is said to be out of spec and the process halted and investigated for unacceptable drift. Additionally, the ratio of $SFM_i/SFM_{MAX}$ can be used to monitor the process, wherein $SFM_i$ is the SFM obtained for the $i^{th}$ measured wafer and $SFM_{MAX}$ is the maximum selectivity value obtained from blanket wafers. A threshold value can be derived for the ratio of $SFM_i/SFM_{MAX}$ beyond which the process is said to be out of bounds.

As can be understood from the above, an in-line inspection and monitoring method has been developed, using XPS spectra taken during various steps of the selective deposition process. The method quantifies the quality of the passivation by providing a Goodness of Passivation (GoP) measurement. The method also quantifies the deposition selectivity by providing a Selectivity Figure of Merit (SFM) and a ratio of the SFM over the maximum achievable selectivity. By setting the allowable values for the GoP, SFM and SFM/$SFM_{Max}$, the process can be monitored in-line and excursions from the allowable values can be flagged to enable investigation into the cause of the excursion. The allowable values for the GoP, SFM and SFM/$SFM_{Max}$, can be stored in the memory of the XPS system, such that the XPS system can issue an alarm when it detects excursion. Conversely, the allowable values for the GoP, SFM and SFM/$SFM_{Max}$, can be stored on a stand-alone computer, together with the measurement program, such that it can obtain the data from the XPS system and perform the analysis to identify excursions of the process.

Figure 4B:
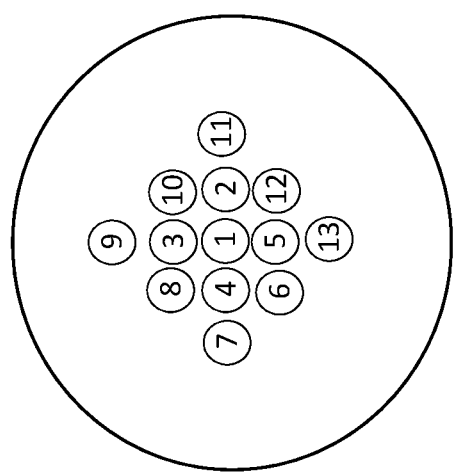
Figure 4A:
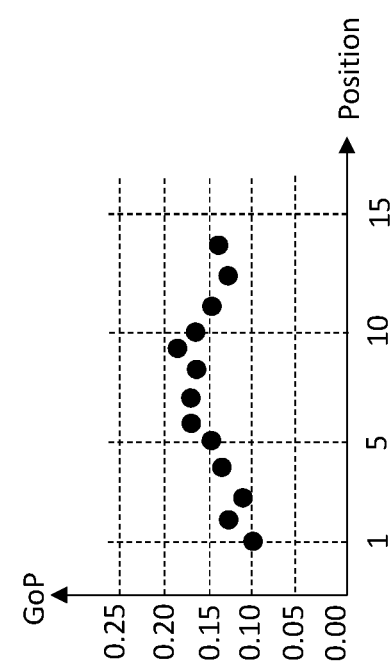

Moreover, the XPS measurements can be done at multiple sites across the wafer and used to generate a map of GoP, SFM and SFM/$SFM_{Max}$ across the wafer to identify non-uniformities in the process. FIGS. 4A-4C illustrate an example wherein FIG. 4B identifies enumerated positions of XPS measurements, FIG. 4A illustrate a plot of the GoP value obtained for each position, and FIG. 4C illustrate a map of the GoP values at each location of the wafer. Similar plots and maps can be generated for the SFM and SFM/$SFM_{Max}$ values.

Figure 5:
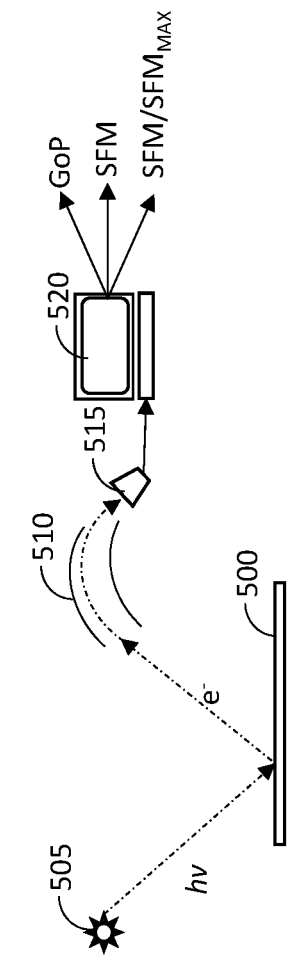
FIG. 5 illustrates an example of an apparatus according to one embodiment.

FIG. 5 illustrates an example of an XPS apparatus according to one embodiment. A photon source 505 illuminates a spot on wafer 500. Photoelectrons are emitted from the wafer 500 and enter an electron kinetic energy analyzer 510. Electrons within the selected energy level exit the analyzer 510 and are collected by the electron detector 515. The signal from the detector 515 is fed to the computer 520, which calculates the GoP, SFM and SFM/$SFM_{MAX}$. The computer 520 may issue alarm upon detecting a process excursion, and/or generate maps as shown in FIGS. 4A-4C.

As shown in FIG. 5, the computer 520 may be a part of the XPS system, may be a part of a manufacturing control system, or may be a stand along computer programmed to execute the embodiments disclosed herein. As such, the invention includes a computer-implemented method for evaluating process integrity in a selective deposition processing environment forming a second layer having a second atomic specie over a first layer having a first atomic specie, comprising executing on a processor the steps of: receiving reference XPS spectra of a reference wafer and generating from the XPS spectra a reference integrated intensity of the first specie and a reference integrated intensity of the second specie; generating a reference value by taking the ratio of the reference integrated intensity of the second specie and the reference integrated intensity of the first specie; receiving sample XPS spectra of a sample wafer and generating from the XPS spectra a sample integrated intensity of the first specie and a sample integrated intensity of the second specie; generating a sample value by taking the ratio of the sample integrated intensity of the second specie and the sample integrated intensity of the first specie; and, generating a quality of process value by taking the ratio of the sample value and the reference value.

In terms of process integration, an embodiment is provided wherein the XPS spectra and analysis is incorporated as an in-line monitoring method to quantify the quality of the process and identify excursions and/or drifts of the process. The embodiment starts with a wafer having a dielectric top layer and metal lines interspersed in the dielectric layer. In one example the dielectric top layer is a low-k dielectric and the metal lines comprise patterned copper lines. The dielectric top layer is referred to as dielectric underlayer, as the objective of the process is to form a second dielectric layer over the dielectric top layer.

The embodiment proceeds to perform metal passivation on the wafer, e.g., placing the wafer in a fabrication chamber to form SAM UDT over the patterned copper lines. When the formation of the passivation is completed, the wafer is transported to an XPS system and XPS spectrum is obtained from the wafer. A sample ratio is then obtained by obtaining an integrated intensity of the signal from the passivation specie and dividing by the integrated intensity of the signal from the metal specie. In the illustrated example the sample ratio is obtained by taking the integrated intensity of sulfur and dividing it by the integrated intensity of copper. A goodness of passivation value is then obtained by taking the sample ratio and dividing it by a reference ratio, wherein the reference ratio is obtained by taking an integrated intensity of the signal from the passivation specie and dividing by the integrated intensity of the signal from the metal specie of a properly passivated reference wafer. The goodness of passivation value is then used to characterize the quality of the passivation by, e.g., comparing it to a preset threshold, comparing it to historical values, etc. Also, the XPS system can be used to take several spectra at multiple locations over the wafer, such that multiple goodness of passivation values can be calculated, one for each XPS spectrum location. Then a table or a map of the values can be provided and used to analyze the uniformity of the passivation over the wafer and the quality of the passivation process wafer to wafer.

When the goodness of passivation value(s) are acceptable, in a further embodiment the process proceeds to forming a second dielectric layer, e.g., by transporting the wafer into an ALD system and performing ALD selective deposition of dielectric material, e.g., HfNx. When the second dielectric layer has been formed, the wafer is transported again to an XPS system and at least one XPS spectrum is taken. From the XPS spectrum, an integrated intensity of metal specie is calculated, and an integrated intensity of the underlying dielectric specie is calculated. In the illustrated example the metal specie is copper and the underlying dielectric specie is silicon. A metal intensity ratio is then calculated by dividing the integrated intensity of metal specie by a reference integrated intensity of metal specie that was obtained from a reference wafer. A dielectric intensity ratio is similarly calculated by dividing the integrated intensity of the dielectric specie by a reference integrated intensity of dielectric specie that was obtained from the reference wafer. A selectivity figure of merit is calculated by dividing the metal intensity ratio by the dielectric intensity ratio, and is used to characterize the quality of the selective deposition process by, e.g., comparing it to a preset threshold, comparing it to historical values, etc. Also, the XPS system can be used to take several spectra at multiple locations over the wafer, such that multiple selectivity figure of merit values can be calculated, one for each XPS spectrum location. Then a table or a map of the values can be provided and used to analyze the uniformity of the dielectric deposition over the wafer and the quality of the selective deposition process wafer to wafer.

In a further embodiment, an XPS system is provided, comprising: an x-ray source configured to illuminate a spot on a wafer; an electron kinetic energy analyzer configured to separate electrons emitted from the spot according to kinetic energy; an electron detector detecting electrons exiting the electron kinetic energy analyzer and generating detection signal; a controller receiving the detection signal and comprising a memory storage and a processor, the memory storage having a reference ratio stored therein; the memory storage further having a program stored therein which, when executed, causes the processor to perform the operations comprising: operating on the detection signal to generate integrated intensity of a first specie and generating integrated intensity of a second specie; generate sample ratio by dividing the integrated intensity of the first specie by the integrated intensity of the second specie; and generating a quality value by dividing the sample ratio by the reference ratio.

In a further embodiment, the memory storage has further stored therein a reference second specie intensity and a reference third specie intensity, and the program further causes the processor to perform the operations comprising: operating on the detection signal to generate integrated intensity of a third specie; generate a second species ratio by dividing the integrated intensity of the second specie by the reference second species intensity; generate a third species ratio by dividing the integrated intensity of the third specie by the reference third species intensity; generate a selectivity value by dividing the second specie ratio by the third specie ratio.

The invention also includes a computer-implemented method for evaluating process selectivity in a selective deposition processing environment forming a second layer over a first layer, wherein the first layer comprises a pattern of a first material having a first atomic specie and a second material having a second atomic specie, comprising executing on a processor the steps of: receiving reference XPS spectra of a reference wafer and generating from the XPS spectra a reference integrated intensity of the first specie and a reference integrated intensity of the second specie; receiving sample XPS spectra of a sample wafer and generating from the XPS spectra a sample integrated intensity of the first specie and a sample integrated intensity of the second specie; generating a first species value by taking a ratio of the sample integrated intensity of the first specie and the reference integrated intensity of the first specie; generating a second species value by taking a ratio of the sample integrated intensity of the second specie and the reference integrated intensity of the second specie; generating a selectivity value by taking the ratio of the first species value and the second species value; and, generating a quality of process value by taking the ratio of the sample value and the reference value.

In the context of this disclosure, a low-k dielectric is a material with a smaller dielectric constant than silicon dioxide. Low-k dielectric can be formed by doping silicon dioxide with fluorine or carbon, by generating pores in silicon dioxide, or by using spin-on silicon based polymeric dielectric materials. The resulting low-k dielectric has dielectric constant lower than 3.9.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

We claim:

1. A method for monitoring a quality of a selective deposition process, the method comprising:
   (a) obtaining, by a computer, at least one first X-ray photoelectron spectroscopy (XPS) spectrum of a region of a sample, the region comprising metal lines interspersed in a dielectric layer; wherein the obtaining is executed before a beginning of a selective deposition process for selectively depositing content on the dielectric layer and not on the metal lines;
   (b) obtaining, by the computer, after a completion of at least a part of the selective deposition process, at least one second XPS spectrum of the region of a sample; and
   (c) determining, by the computer, a quality associated with the selective deposition process based on an attenuation of metal lines species information related to the at least one first XPS spectrum and to the at least one second XPS spectrum.

2. The method according to claim 1, wherein the selective deposition process comprises one or more passivation processes.

3. The method according to claim 1, wherein the at least one first XPS spectrum is obtained following a passivation of the metal lines with one or more layers of one or more materials, wherein the selective deposition process comprises depositing one or more other materials.

4. The method according to claim 3, wherein the one or more materials are self-assembly monolayers (SAM) of undecanethiol (UDT), and the one or more other materials comprise Hafnium nitride (HfNx).

5. The method according to claim 1, comprising repeating steps (a)-(c) for a plurality of regions of the sample.

6. The method according to claim 1, wherein the determining of the quality comprises calculating a ratio between metal lines species information related to the at least one first XPS spectrum and metal lines species information related to the at least one second XPS spectrum.

7. A system for monitoring a quality of a selective deposition process, the system comprising:
   a photon source configured to:
      perform a first illumination of a region of a sample, the sample comprising metal lines interspersed in a dielectric layer; wherein the first illumination is executed before a beginning of a selective deposition process for selectively depositing content on the dielectric layer and not on the metal lines; and
      perform a second illumination of the region of the sample after a completion of at least a part of the selective deposition process;
   an electron kinetic energy analyzer that is configured to:
      perform energy level based filtering of photoelectrons emitted from the region due to the first illumination; and
      perform energy level based filtering of photoelectrons emitted from the region due to the second illumination;
   a detector that is configured to measure kinetic energies and numbers of photoelectrons outputted from the electron kinetic energy analyzer due to the first illumination and due to the second illumination;
      (i) perform first measurements of kinetic energies and numbers of photoelectrons outputted from the electron kinetic energy analyzer due to the first illumination;
      (ii) perform second measurements of kinetic energies and numbers of photoelectrons outputted from the electron kinetic energy analyzer due to the second illumination
   a computer configured to:
   determine at least one first XPS spectrum based on the first measurements;
   (b) determine at least one second XPS spectrum based on the second measurements; and
   (c) determine a quality associated with the selective deposition process based on an attenuation of metal lines species information related to the at least one first XPS spectrum and to the at least one second XPS spectrum.

8. The system according to claim 7, wherein the selective deposition process comprises one or more passivation processes.

9. The system according to claim 7, wherein the at least one first XPS spectrum is obtained following a passivation of the metal lines with one or more layers of one or more materials, wherein the selective deposition process comprises depositing one or more other materials.

10. The system according to claim 9, wherein the one or more materials are self-assembly monolayers (SAM) of undecanethiol (UDT), and the one or more other materials comprise Hafnium nitride (HfNx).

11. The system according to claim 7, wherein the computer is configured to repeat steps (a)-(c) for a plurality of regions of the sample.

12. The system according to claim 7, wherein the determining of the quality comprises calculating a ratio between metal lines species information related to the at least one first XPS spectrum and metal lines species information related to the at least one second XPS spectrum.

* * * * *